US010151794B2

(12) United States Patent
Mueller-Schniek

(10) Patent No.: US 10,151,794 B2
(45) Date of Patent: Dec. 11, 2018

(54) SLEEK SERIAL INTERFACE FOR A WRAPPER BOUNDARY REGISTER (DEVICE AND METHOD)

(71) Applicant: X-FAB SEMICONDUCTOR FOUNDRIES AG, Erfurt (DE)

(72) Inventor: Ulrike Mueller-Schniek, Ottendorf-Okrilla (DE)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 15/319,843

(22) PCT Filed: Nov. 14, 2014

(86) PCT No.: PCT/IB2014/066052
§ 371 (c)(1),
(2) Date: Dec. 19, 2016

(87) PCT Pub. No.: WO2015/193707
PCT Pub. Date: Dec. 23, 2015

(65) Prior Publication Data
US 2017/0139007 A1    May 18, 2017

(30) Foreign Application Priority Data

Jun. 19, 2014  (EP) .................................... 14173197
Jun. 22, 2014  (EP) .................................... 14173369
(Continued)

(51) Int. Cl.
G01R 31/28     (2006.01)
G01R 31/317    (2006.01)
(Continued)

(52) U.S. Cl.
CPC ... *G01R 31/31703* (2013.01); *G01R 31/3177* (2013.01); *G01R 31/31712* (2013.01);
(Continued)

(58) Field of Classification Search
CPC ........ G01R 31/31703; G01R 31/31712; G01R 31/31725; G01R 31/31727;
(Continued)

(56) References Cited

U.S. PATENT DOCUMENTS 6,671,844 B1 * 12/2003 Krech, Jr. .............. G11C 29/56
                                                   714/736
6,813,739 B1 * 11/2004 Grannis, III ....... G01R 31/2815
                                                   714/729
(Continued)

FOREIGN PATENT DOCUMENTS

WO    WO 2003005211    1/2003

OTHER PUBLICATIONS

Mike Ricchetti Overview of Proposed IEEE P1500 Scaleable Architecture for Testing Embedded Cores Jun. 20, 2001; IEEE.*
(Continued)

*Primary Examiner* — Guerrier Merant
(74) *Attorney, Agent, or Firm* — Hunton Andrews Kurth, LLP

(57) ABSTRACT

Invention achieves reduced amount of terminals to control a test mode, test function and test results of a given standard for at least one "wrapped core" (40,100) (a core 100 surrounded by a wrapper boundary register (40) as "wrapper chain"). Test flexibility and speed of testing the core (100) are also improved. Suggested serial test interface comprises a state machine (210) and an instruction register (213) for wrapper-instructions, supplied through a single physical data input terminal (1*a*). The state machine (210) reads wrapper-instructions held by the instruction register (213)

(Continued)

and generates on-chip wrapper control signals (30) of the given standard for the wrapper boundary register (40) of the core (100). At least one wrapper-instruction read from the Instruction Register (213) provides at least one wrapper control signal (30). The single input terminal (1*a*) also supplies an input test signal SDI for coupling to the wrapper boundary register (40) as on chip logical input test signal WSI. A single output terminal (1*b*) returns an output test signal SDO from an output WSO of the wrapper boundary register (40). Invention may apply to IEEE 1500 control signals.

31 Claims, 10 Drawing Sheets

(30) Foreign Application Priority Data

| | | |
|---|---|---|
| Jul. 21, 2014 | (EP) | 14177914 |
| Aug. 15, 2014 | (EP) | 14181203 |
| Aug. 22, 2014 | (EP) | 14182029 |
| Nov. 10, 2014 | (EP) | 14192507 |

(51) Int. Cl.
  *G01R 31/3185* (2006.01)
  *G01R 31/3177* (2006.01)
(52) U.S. Cl.
  CPC . *G01R 31/31725* (2013.01); *G01R 31/31727* (2013.01); *G01R 31/318508* (2013.01); *G01R 31/318558* (2013.01)
(58) Field of Classification Search
  CPC ........ G01R 31/3177; G01R 31/318558; G01R 31/318561; G01R 31/318563; G01R 31/318572; G01R 31/31723; G01R 31/318508; G01R 31/318536; G06F 9/30101; G06F 9/3016; G06F 17/5081
  See application file for complete search history.

(56) References Cited

U.S. PATENT DOCUMENTS

| | | | |
|---|---|---|---|
| 6,988,230 B2* | 1/2006 | Vermeulen | G01R 31/318558 714/727 |
| 7,404,129 B2 | 7/2008 | Whetsel | |
| 8,412,992 B2 | 4/2013 | Whetsel | |
| 2003/0131296 A1* | 7/2003 | Park | G01R 31/318508 714/727 |
| 2004/0128596 A1* | 7/2004 | Menon | G01R 31/318508 714/724 |
| 2005/0005217 A1* | 1/2005 | Whetsel | G01R 31/318508 714/727 |
| 2006/0107160 A1* | 5/2006 | Ricchetti | G01R 31/318563 714/742 |
| 2012/0159275 A1 | 6/2012 | Whetsel | |
| 2012/0233514 A1 | 9/2012 | Patil | |
| 2016/0216327 A1* | 7/2016 | Napolitano | G01R 31/318561 |

OTHER PUBLICATIONS

Ed L. Whetsel, Institute of Electrical and Electronics Engineers: "Addressable Test Ports an Approach to Testing Embedded Cores," Proceedings International Test Conference 1999. ITC'99. Atlantic City, NJ, Sep. 28-30, 1999 [International Test Conference], New York, NY: IEEE, US, vol. Conf. 30, Sep. 1, 1999, pp. 1055-1064; XP000928935, ISBN: 978-0/7803-5754-9; the whole document.
[EPO] International Search Report and Written Opinion of PCT/IB2014/066052 dated Feb. 16, 2015.
"Boundary Scan", https://en.wikipedia.org/wiki/Boundary_scan, Dec. 12, 2013, pp. 1-4.
"I²C", http://de.wikipedia.org/wiki/I²C-Wikipedia, Jul. 24, 2014, pp. 1-5.
Higgins et al., "IEEE 1500 Wrapper Control Using an IEEE 1149.1 Test Access Port", ISSC 2008 Galway Jun. 18-19, pp. 198-203, 2008.
"Joint Test Action Group", http://de.wikipedia.org/wiki/Joint_Test_Action_Group-Wikipedia, Dec. 12, 2013, pp. 1-6.
"Finite-state machine", https://wikipedia.org/wiki/Finite-state_machine-Wikipedia, Jun. 22, 2014, pp. 1-12.
Refan et al., "An IEEE 1500 Compatible Wrapper Architecture for Testing Cores at Transaction Level", pp. 1-5, Dec. 3, 2008.
DaSilva et al., "Overview of the IEEE P1500 Standard", pp. 988-997, 2003.
DaSilva et al., "The Core Test Wrapper Handbook", pp. 13-19, 2006.
McLaurin, "IEEE Std. 1500 Complaint Wrapper Boundary Register Cell", pp. 1-8, Jun. 15, 2005.

* cited by examiner

1* System on Chip
STI  Serial Test Interface
CI   Chip Interface

/x may be more than one WSO

TMS = Test Mode Select

Figures 7 (comparison of architectures)
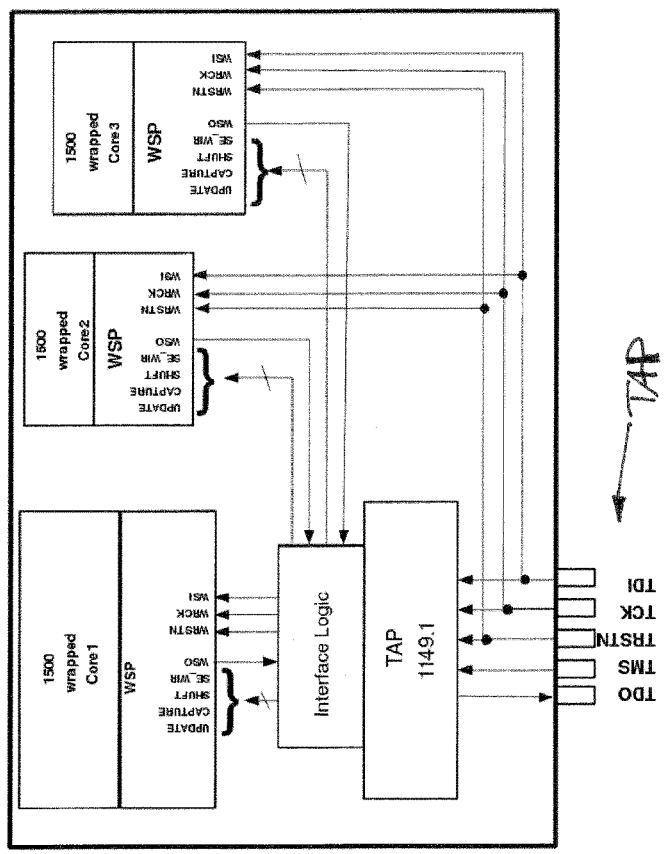
Fig. 7b SoC with Fig. 5b configuration
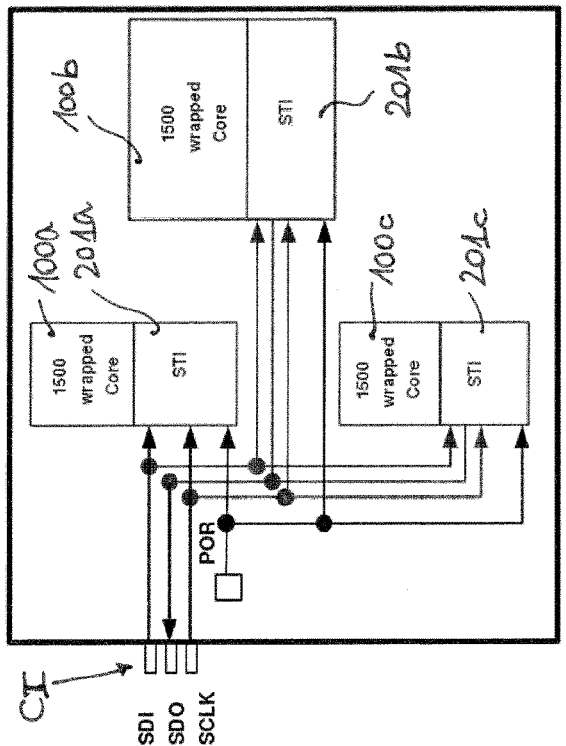
Fig. 7a - SoC with Fig. 4 configuration

SLEEK SERIAL INTERFACE FOR A WRAPPER BOUNDARY REGISTER (DEVICE AND METHOD)

The invention concerns a serially operable interface device for testing purpose (STI) on a chip and its applications and uses. The interface device is configured for generating control signals for a Wrapper Boundary Register (WBR) on a chip level of a chip. The wrapper control signals comply with a given standard for testing a core device that is surrounded by the Wrapper Boundary Register with many cells. The core device is provided on the chip as well and has the Wrapper Boundary Register of several cells for internal testing.

IEEE 1500 standard was created to address test complexity of System on Chips (SoCs), see Overview of the IEEE P1500 Standard, daSilva, Whetsel et al, ITC INTERNATIONAL TEST CONFERENCE, paper 38, 2003 and THE CORE TEST WRAPPER HANDBOOK, Springer, 2006, chapter 2. The standard provides a standard interface and a set of rules for creation of an isolation boundary between a core and the logic external to the core. The purpose of the isolation boundary or wrapper is to allow for isolated test of the core with minimal signals that must be ported out to the SoC level. "The wrapper" comprises several wrapper cells for each functional input and output port, see above ITC INTERNATIONAL TEST CONFERENCE, item 2.2.2.2. Flip-flops may be utilized as wrapper cells and are connected into a wrapper scan chain or chains. The wrapper chains are used in place of the functional ports during test to control and observe the core logic.

This is what allows the core to be isolated from any external logic during test and still get full coverage of the core for its screening, see IEEE Standard 1500 Compliant Wrapper Boundary Register Cell, by Teresa L. McLaurin, and An IEEE 1500 Compatible Wrapper Architecture for Testing Cores at Transaction Level, by Fatemeh Refan et al, University of Tehran, ewdts 08-80, December 2008, item 2.2.

Other IEEE 1500 compliant interfaces using TAP IEEE 1149 controller (as state machine) are shown in U.S. Pat. No. 8,412,992 (Whetsel, TI), see FIG. 83 and that claim 1, item B in col. 26 identifying the exact signal names. U.S. Pat. No. 7,404,129 (Whetsel, TI) discloses said test port and its surrounding, see that claim 1 in col. 31 having TDI, TDO and TMS signals as well as a TCK clock (in group A of said claim 1) and a wrapper serial port WSP that is IEEE1500 as compliant (in group B of said claim 1) using signals WSO, WSI of said standard core testing signals. Another approach in US 2012/0459 275 (Whetsel, TI) makes use of a TAP controlled WSP, eventually merging them to form a single optimized test interface. The claim to that invention is devoid of specific signal names, see that claim 1 in col. 17, but publishes 59 pages of figures and drawings next to meager 3 claims.

The relationship in electronics testing between the IEEE 1500 standard and the IEEE 1149.1 standard is very close, where the IEEE 1149.1 standard focuses on the testing of boards and the IEEE 1500 standard focusses on the testing of embedded cores within System on Chips (SoC) on the boards.

IEEE 1500 applies to "wrapped embedded cores" within an SoC using an IEEE 1149.1 Test Access Port (TAP). The test controller can be based on a conventional IEEE 1149.1 state machine. The input/output signals of each core are usually not accessible from the SoC top level so efficient mechanisms are required to transport test vectors to and from the embedded wrapped cores called Test Access Mechanisms (TAMs). The efficient allocation of the lines that make up the TAMs between the wrapped cores can reduce total test time. For example, for a test SoC design with ten wrapped cores and 15 TAM lines using a TAM allocation algorithm, it was calculated that core 1 uses TAM lines 1 to 9 for test data, core 2 uses TAM lines 10 to 14 for test data and the remaining cores use the remaining TAM line(s). The TAM was effectively divided into three TAM sections, TAM section 1 is TAM lines 1 to 9, TAM section 2 is TAM lines 10 to 14 and finally TAM section 3 is the remaining TAM line(s).

It was not possible to individually control each WIR (Wrapper instruction register) from off-chip resources as each WIR requires eight signals (concurrent testing of IEEE 1500 compliant wrapped cores). If there are e.g. ten wrapped cores on-chip, then eighty SoC clock/input/output pins would be required for control of the wrapper chains. This is definitely a lot. The test controller presented in that paper used the five IEEE 1149.1 TAP signals to control all of the WIRs in the SoC. The test controller also reduced the complexity of the off-chip Automated Test Equipment (ATE) by carrying out the control of the WIR, cf. published ISSC 2008, Galway, June 18, 19, IEEE 1500 Wrapper Control using an IEEE 1149.1 Test Access Port by Michael Higgins, Ciaran MacNamee, Brendan Mullane.

The above paper by Michael Higgins et al. made an approach to use several cores that are tested by a TAP (Test Access Port) controlled state machine, see figures 5, 6 of this paper and page 201, right column, second paragraph. They use a TAM section state machine in the test controller to provide the function of routine test data between the off-chip test intelligence and the cores under test (which they call CUTs). The test port of the TAP state controller is common and in the IEEE 1149.1 standard and it uses five signals as shown in figure 5 of this paper from Higgins. Adding to this state machine that is shown in figure 6 a TAM controller, it identified which of the digital cores is tested with those signals that are supplied by the TAP state machine and its states (here called a "multi arm test").

A similar approach with a multi arm test is shown in our FIG. 5b where the same TAP state controller with those five standard signals links through an Interface Logic to several wrapped cores that use IEEE 1500 standard signals. Such control is not working without this additional Interface Logic shown in our FIG. 5b.

To simplify such a multi-arm test control of a System on Chip having several cores is one of the goals this invention has (seeking to satisfy the needs, discovered in prior art). Another goal is to minimize or reduce the amount of terminals (pins or leads) that are needed to supply test information from an outside intelligence, such as an external testing master "eTM". For example, the IEEE 1149.1 standard uses five test signals (TDI, TDO, TCK, TRST, TMS). The IEEE 1500 standard uses a minimum of eight signals for operation of the wrapper in a test mode (a clock, an input, an output and five control signals).

It is thus a fair object of this invention to further reduce the amount of terminals used to control the test mode, test function and the test results of at least one "wrapped core". On top of this, it is intended to at least maintain or even enhance the test flexibility and moreover to improve the speed of testing the wrapped core(s). Even the required chip surface should be reduced.

This is achieved by one of independent claims 1, 15 and 34 or 41, suggesting a wrapper instruction controlled interface device that operates serially.

This is achieved by one of independent claims 25, 28, 30, 31 and 38, suggesting a serial operation of the interface device and several operational highlights.

One highlight is the generation of a CaptureWR signal by a state machine immediately after the WBR control signal UpdateWR (claim 38), another highlight is a test method of testing wrapped cores within a System on Chip, wherein each wrapped core is equipped with an own serial interface device (claim 25), another highlight is a method to skip a state of a state machine by skipping reading a device-address using a first bit (FIN) in a corresponding FIN register to determine whether multiple transactions are implemented for the selected interface device (claim 28), another highlight is a method of generating additional Wrapper Boundary Register (WBR) control signals by the state machine on a chip, wherein the additional WBR control signal is generated by the state machine upon completion of a READ_INSTRUCTION (claim 31), another highlight is a method of generating IEEE 1500 Wrapper Boundary Register (WBR) control signals by said state machine having several states, the state machine being part of a functional slave in a System on Chip (SoC) configuration, another highlight is a generating an active-low wrapper reset signal WRSTN by the state machine upon completion of a state READ_INSTRUCTION in a state IDLE, whenever an Instruction Register contains a WS_RESET instruction (Claim 30).

The object is as well solved or satisfied by an independent Layout for a customer (claim 32). This invention and all embodiments thereof (claim 33 as several alternatives) refers to a Layout that is prepared for designing a real chip. The Layout is supplied to a customer who adds own features, such as the amount of cores on his chip or hard-coded device-addresses of each applied serial test interface on the customer's chip. Then the masks are prepared and the chip is produced. The functions are prepared on the Layout and the claim should be read correspondingly.

One serial test interface device (Claim 1) includes a physical data input, a physical data output and a physical clock input. Those physical attributions are meant to be understood to read as terminals or pins on a chip or in a representatives therefore in a Layout. The chip itself usually is mentioned using "on chip level", meaning that the serial operable test interface is on said chip and could be on said chip multiple times for multiple cores that each have the surrounding wrapper boundary register. Therefor each serial interface device further comprises an Address Register for holding a received address for comparison to its own device-address. Thus many cores can be tested and each core is associated with one of those serially operable interface devices. Each of those devices has an own address. This address is unique and not used again on this chip. Testing can therefore be addressed to the serially operable test interface with a certain address that tests a core device that has a wrapper boundary chain around it (see claim 25 for its operation).

Reducing it to only one serially operable test interface will explain the structure and therewith the function (claim 15); an Address Register may to this end be omitted. This basic understanding can then be multiplied for multiple use of several such interface devices for several such wrapper boundary register associated core devices (claim 25).

The physical data input, physical output and the physical clock signal are the only signals that are physically used by no more than three terminals. Thus the amount of test enabling terminals is further reduced to at most three. And will not increase if more cores are provided on the chip (Claims 25, 26, 27).

Using those three terminals that carry the signals SDI, SDO and SCLK, the serially operable interface device is coupled to those signals (or vice versa). The interface device has a control logic including a state machine. This control logic is supplemented with an address register and an instruction register, preferable a counter (register) as well (claims 2, 14, 18). The embedded state machine generates from an instruction contained in the instruction register the required control signals for the Wrapper Boundary Register. The clock SCLK and input SDI supply an instruction to the Instruction register to generate—at least four—on-chip control signals (as "output" from the state machine) that are supplied to the wrapper boundary register to on-chip control of the tests of the core surrounded by the (one or more) Wrapper Boundary Register (WBR). These signals are compliant with the given standard, such as the IEEE 1500 standard, although the physical input pins to the chip are much less than needed for that standard, such as the IEEE 1500 standard.

The third terminal (pin or lead) on the chip or layout (as "representing" a physical terminal in the Layout) is an output that supplies the SDO signal of the SoC, originating from WSO signal of the WBR.

Thus a sleek serial interface "SSI" or chip interface "CI" for a Wrapper Boundary Register is created that supplies full functional test performance and less terminals or leads needed for such tests. Still it satisfies the given standard for core testing using Wrapper Boundary Register and enhances test flexibility. The terminal count will be reduced as wrapper instructions are sent serially through the SDI terminal to the Instruction Register for use by the state machine (that is embedded in the control logic). Delay time testing may still be performed as it can be ascertained that certain signals are immediately consecutive (claim 38).

The state machine has a certain configuration which uses those one or two registers that were mentioned. The Instruction Register and preferably a Counter (also called a register having a certain counting value).

A target address can be supplied and held by the address register and the value of this address register addresses a certain serially operable interface device (serving one core of many other cores each having an own serial interface device STI). The address register's content is compared to a given address attributed to this "device" (this STI and the attributed core). The address of each device can be hard-coded (in a layout) or can be attributed to the STI by a register or certain hardware on chip, such as DIL switches or wire-bridges.

The Instruction Register contains a wrapper instruction and the counter may be used to operate the state machine's changes of states (claims 14 and 18). The state machine within the control logic is then configured to provide Wrapper Control Signals WSC according to the wrapper instruction that is held by the instruction register.

Thereby the state machine generates and provides on-chip at least most of the control signals of the given standard for the core device having the wrapper boundary register (WBR), preferably all control signals of the WBR (claim 4). Those control signals that are optional may be optional as well, see the optional ninth control signal, IEEE Standard 1500 Compliant Wrapper Boundary Register Cell by Teresa L. McLaurin, page 2, first para. Even another signal of the given standard must not and will not be generated by the state machine, so the SelectWIR signal. Nominally the control signals that are generatable by the state machine upon one or more instructions successively active in the IR (Instruction Register) that itself receives the bits of each instruction serially through the SDI port may be CaptureWR, ShiftWR, UpdateWR and WRSTN of the IEEE 1500 standard.

The SelectWIR signal not being a WBR control signal, but a WSP (wrapper serial port) control signal.

Those on-chip generated control signals have not been passed through separate terminals, but have been built by the state machine on-chip, and depending on instructions received through the test-input terminal SDI of the chip.

The state machine will control the behavior of testing via own generated control signals. It may control the wrapper chain for its signal paths, and for the signals contained in the cells. The return signals from the wrapper cells to the single output of the chip by "coupling" of the WSO test output of the Wrapper Boundary Register to the SDO output of the chip (in interface claim 34 in the end) is organized by the control logic. Thereby the state machine assures full control of the WBR although no control signals have to pass the chokepoint of the physical interface of the chip.

The serial interface may return signals from said wrapper boundary register that are initiated by handling instructions from said external master and returning data (such logical data) as output data (SDO) to said physical data output terminal and to said outside test master eTM for evaluation (claim 1, last group of features). Or the return signal from said wrapper boundary register may be directly fed to the single output terminal of the chip.

The serial test interface (claims 34, 41) comprises an Instruction Register to receive and hold wrapper-instructions supplied through the physical data input terminal. Provided is a state machine for handling transactions from an external master. The state machine is configured to read a currently active wrapper-instruction (WI), as held by the Instruction Register and generate and provide one or more on-chip wrapper control signals of the given standard for a core device having the Wrapper Boundary Register according to a wrapper-instruction read from the Instruction Register.

There may be more than one wrapper control signals generated from one WI, and there may be WIs that are not directly related to generate wrapper control signals, but control other units or circuits on the chip, preferably in the serial test interface that includes the state machine and the control logic.

The "currently active wrapper instruction" may generate different control signals (as outlined in claim 30). In a more general approach (claims 41, 42, 43) one wrapper instruction (WI) in the Instruction register (IR) may provide for up to three different Wrapper Boundary Register control signals (WBR control signals) generated by the state machine. They are caused by the specific WI and generated by the state machine.

The single terminal supplying the input test signal is coupled to the Wrapper Boundary Register as on chip logical input test signal (WSI). It may additionally be fed to the control logic (containing the state machine), to enable certain functions there, but it is certainly connected to the Instruction Register for supplying the wrapper instruction and may be connected to the Address Register, when present, to send a device-address quest thereto, that is designed to select one of multiple serial test interfaces, when read and compared to the serial test interface device address present in each serial test interface. The Address Register may be omitted, when only one serial test interface is present on the chip.

Please acknowledge that this description of several inventions uses several abbreviations that have become common in the art when using IEEE 1500 and IEEE 1149.1 standards. Those names of signals are acronyms that have in part further being abbreviated in our disclosure, for example the IEEE 1500 signal CaptureWR is called CW and ShiftWR is called SW, still making them unique, but shorter for purpose description.

Well, our claims 1, 15, 34 and 41 and their construction or understanding is not meant to only address IEEE 1500 standard, but also addresses other or further or future standards that might evolve in the future, also requiring certain given signals. Therefore the names of those signals have not been used as limiting features in the independent claim, but have been included in the dependent claims (claims 3 to 5), when specifically addressing IEEE 1500 standard. Contrary to this, independent claim 30 expressly claims generating the signals of IEEE 1500 standard (but does not prohibit to generate or use the standard signals otherwise—the Standard is still free, claim 31 just specifically generates the standard control signals).

For this IEEE 1500 standard we should mention that not all signals must be present in the implementation using the state machine within the control logic. There might be redundant signals that may not be generated. And there might be additional (new) signals added to the standard. Still, those signals that are used and that are generated by the state machine and that are contained in the standard will be in compliance with the standard used, such as the IEEE 1500 standard. Thus mentioning this standard in a claim not necessarily includes all its standardized signals in this claim, unless certain signal names of the standard are expressly identified in the claim.

We should mention that the chip that has the one or more cores (core devices) might and will have a lot of other terminals (leads or pins) that relate to the function of the chip, but the amount of terminals dedicated to testing is according to the invention limited to an amount being less than to date used in prior art.

The invention allows skipping a state in operating the state machine (Claim 28). That is to skip reading a device address, e.g. READ_DEV_ADR, thus reading the device address is skipped in the next transaction. A serial interface device, preferably the one disclosed in claim 1 or 15, receives a device address with the first bit (FIN) in a register.

A one bit FIN (Following INstruction) may be sent with the Device Address. If FIN=1 further instructions will follow for the selected serial test interface (as slave). Thereby the device address has to only be sent once. This is another advantage of the invention of claim 28.

Each wrapped core may have its own serial test interface that is directly and individually controlled by the single off chip test master eTM (claim 25). The master is located outside the chip (off-chip), e.g. the tester. Additional surplus operational logic on chip is not necessary.

The eTM selects the desired serial test interface (called "desired slave" in this configuration as one master operated multiple slaves in parallel). This is done by sending the device-address of the targeted slave.

In this configuration the one bit FIN (Following INstruction) may also be used and sent with the device-address. Only if FIN has determined "follow instruction state(s)" (this may either be by a ONE or a zero as FIN-bit status) further instructions will follow for the selected slave. Thereby the device-address has to only be sent once.

The selection was made by the device-address match.

When the "follow instruction bit" has the other (opposite) value as status (this may either be ZERO or one) the device-address is sent in the next cycle (transaction). Claim 28 may be applied to the invention of claim 25 or the serial test interface of claim 1 or 16 or 17, when the STI is provided multiple times on the chip. Claim 28 may also be combined with a delay time testing feature of claim 38.

The methods of claims 31 and 30 are incorporated by reference (without reference signs) here.

The "currently active wrapper instruction" may generate different signals (as outlined in claim 30). In a more general approach a wrapper instruction (WI) in the Instruction register (IR) may provide for up to three different Wrapper Boundary Register control signals (WBR control signals) generated by the state machine.

Normally three such control signals are generated for one active WI (wrapper instruction). They are CaptureWR, ShiftWR and UpdateWR. But there are other WI that generate less Wrapper Boundary Register control signals, e.g. WS_SHIFTUPDATE as WI does not generate control signal CaptureWR, as the state READ_DATA is skipped. Not having or not using or not reaching the READ_DATA state there is no generation of CaptureWR (as understood from the claimed terms "in a state READ_DATA" in the first group of features of claim 30. There is a significant advantage of the claimed method of this claim. In a comparison with control of a WBR by known port TAP/WSP the generation of CaptureWR may not be skipped and UpdateWR is not generated for e.g. WS_PRELOAD as WI, see the terms of claim 30 asking for "based on the currently active wrapper instruction" in the third group if features. This WI blocks or inhibits an update (UpdateWR).

Claim 32 and its eventual embodiment in claim 33 (as several alternatives) refer to a Layout that is prepared for designing a real chip. The Layout is supplied to a customer who adds own features, such as the amount of cores on his chip or hard-coded device-addresses of each applied serial test interface on the customer's chip. The functions are prepared on the Layout and the claim should be read to as being on Layout-Level, designed or configures to build a corresponding real function upon chip production, e.g. an Instruction Register in the Layout is designed to build an Instruction Register in the real chip, same for the Address Register and the state machine. The terminals are represented in the Layout as representing terminals on the chip.

The Layout is designed for a serial test interface (claim 32). It comprises a layout for an Instruction Register to receive and hold wrapper-instructions supplied through a representation of a physical data input terminal and a layout of a state machine for handling transactions supplied thereto. The state machine is "layouted" to read a wrapper-Instruction from the Instruction Register and generate and provide wrapper control signals of the given standard to the core device having the Wrapper Boundary Register according to the each wrapper-instruction read from the Instruction Register. A representation of a single input terminal is provided to supply an input test signal (SDI) coupled to the Wrapper Boundary Register as logical input test signal. A representation of a single output terminal is provided to return an output test signal coupled to the representation of the output terminal from an output (WSO) of the Wrapper Boundary Register of the core device.

IEEE 1500 Standard was developed to test embedded cores within a SoC (System-on-Chip). The embedded cores have IEEE 1500 wrapper around all its inputs and outputs. Serial access to the wrapper is possible by use of the IEEE 1500 Wrapper Serial Port (WSP). The WSP comprises eight mandatory terminals for Wrapper Serial Control (WSC). To reduce the pin-count, the IEEE 1149.1 Test Access Port (TAP) controller is often used to generate WSC signals without using the WSC terminals. To this end the IEEE 1500 WSP was controlled by an on-chip IEEE 1149.1 TAP controller, see FIG. 5. The IEEE 1149.1 TAP (Test Access Port) comprises 4 to 5 terminals. But the use of WSP without TAP controller provides more test flexibility, because the WSC signals can be directly applied. Still, more test terminals are to be provided on the chip.

Further to an acquired lower test terminal (pin or lead or corresponding representation in the Layout) count in the claimed interface the test flexibility is even higher and can provide test of delay times as compared to the IEEE 1149.1 TAP state machine used to generate WSC signals.

It is also not possible to skip Capture-DR and Capture-IR when the IEEE 1500 WSP is controlled by an on-chip IEEE 1149.1 TAP controller. This results in longer testing times in prior art.

Delay testing is not possible when the IEEE 1500 WSP is controlled by the on-chip IEEE 1149.1 TAP controller, because CAPTURE-Signal is not generated immediately after UPDATE-Signal by the IEEE 1149.1 state machine in the prior art configuration.

To control multiple IEEE 1500 wrapped cores through the IEEE 1149.1 TAP on a chip (SoC design) additional interface logic would be necessary. The invention avoids this according to claim 25 and saves chip space.

Substantial advantage of the claimed invention is the fact that the sleek serial test interface may operate with a small number of pins at a high clock frequency. The claimed interface requires only one input pin and one output pin and one clock pin which have to be connected to terminals at the SoC level (the chip level).

Further the claimed invention provides higher test flexibility, because the Wrapper Boundary Register signals CaptureWR, ShiftWR and UpdateWR are generated based on a currently active wrapper instruction in the corresponding Instruction Register. Thus it is possible to skip the CAPTURE-signal and/or to omit the Update-signal.

Delay time testing of the WBR is available via generating CaptureWR immediately after UpdateWR (claim 38). The method of generating a regulation-compliant Wrapper Boundary Register (WBR) control signal CaptureWR by a state machine. The generation occurs immediately after the WBR control signal UpdateWR. The generation of the WBR control signal CaptureWR is performed by the state machine in a state READ_UPDATE based on a counting contents of a counter register—this whenever an Instruction Register contains an instruction that calls for "delay time testing".

Another advantage of another claimed invention is the generation of at least one additional Wrapper Boundary Register control signal (claim 31), e.g. WCH_RESET. With the WCH_RESET signal is it possible to set back (reset) one or more access signals. The contents of the other shift-registers are not modified, because the state machine does not generate CaptureWR, ShiftWR and UpdateWR. Thus time-consuming shift cycles are avoided in the Wrapper Boundary Register and the test time is greatly reduced.

Examples are shown to enable the inventions as claimed. They are not to limit the claimed inventions, but to enable them to the "Fachmann" (the man skilled in the art of testing chips and wrapped cores).

FIG. 1 functionally illustrates registers of one example of a serial test interface 201 with less terminals SDI and SDO for test functions. A clock terminal has to be added.

FIG. 1a is a map coordination where the mentioned signals are connected to control logic 209 and state machine 210 in FIGS. 1 and 2.

FIG. 2 illustrates the FIG. 1 architecture with an IEEE 1500 wrapped CORE 100 and with more structural definitions than the functional outline of FIG. 1 supplies to the reader.

FIG. 3 illustrates an example state machine 210 and the states 500 to 550 in a state transition diagram 301.

FIG. 7 illustrates a comparison of FIG. 5b (prior art) and the new configuration of several serial test interfaces 201a, 201b, 201c at IC-level, each one attributed to one core 100a, 100b, 100c and having own device address as shown in FIG. 4. The achieved reduced wiring and logic reduction advantage is evident.

Figure 6:
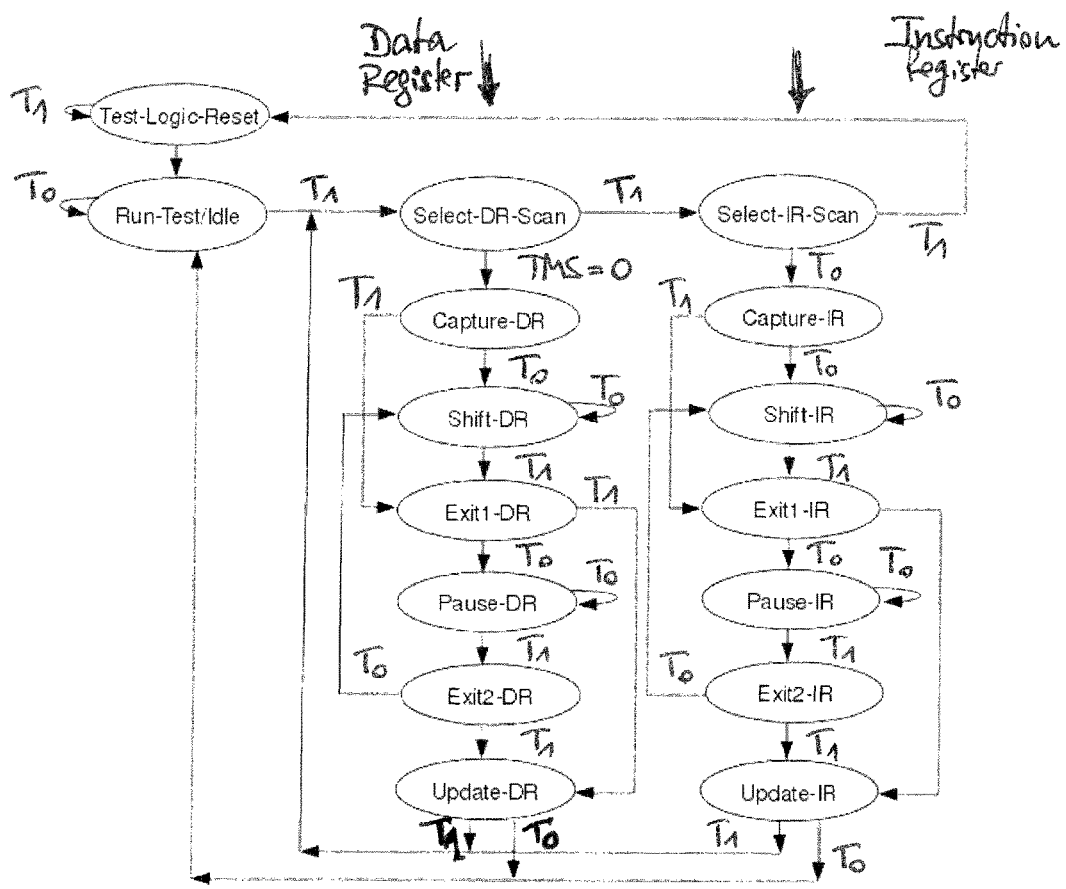
FIG. 6 is prior art and illustrates the state sequence as depending on the TMS signal of the TAP port, as published in ISSC 2008, Galway, June 18, 19, IEEE 1500 Wrapper Control using an IEEE 1149.1 Test Access Port by Michael Higgins, Ciaran MacNamee, Brendan Mullane, there FIG. 2. All state changes depend upon the TMS signal (1) of the TAP state machine.

FIG. 6 illustrates the known IEEE 1149.1 TAP finite state machine. The Wrapper Serial Control (WSC) signal generation through the TAP controller is based on this TAP state machine. In this state machine it is not possible to skip for example Capture-DR and Capture-IR.

Figure 1:
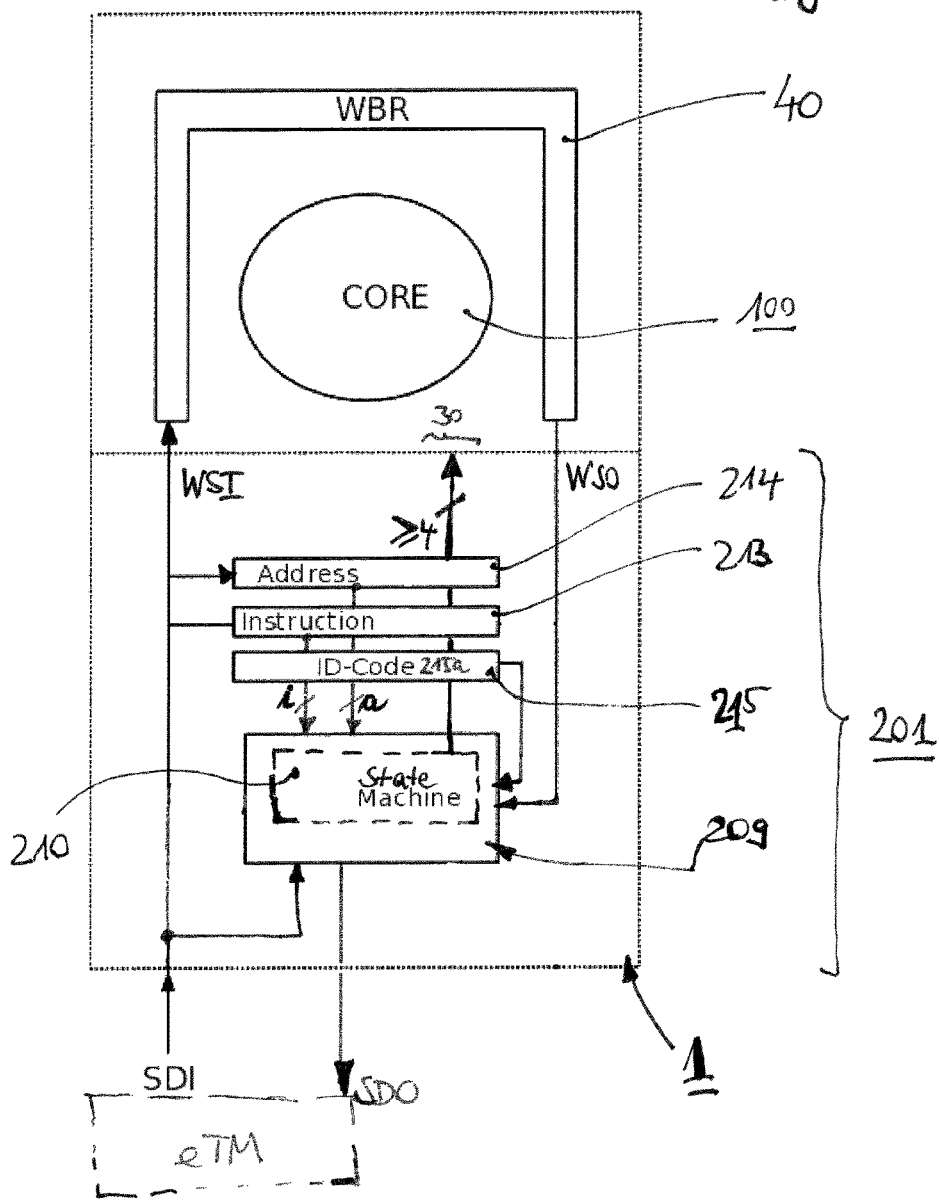

FIG. 1 illustrates the new architecture with an IEEE 1500 wrapped CORE 100 and with the serial test interface 201, both on a chip 1 and linked to the test master eTM 10 through a reduced set of terminal 1a, 1b and 1c.

Only two signals (SDO and SDI) and one clock signal (SCLK) have to be connected to corresponding test terminals at IC level 1. The Wrapper Boundary Register 40 control signals 30 are: CaptureWR, ShiftWR, UpdateWR and WRSTN and are generated by the state machine 210 of the serial test interface 201. These wrapper control signals 30 operate the IEEE 1500 wrapper 40 in test mode.

Additional Wrapper Boundary Register control signals, e.g. WCH_RESET may also be generated by the state machine 210.

Figure 2:
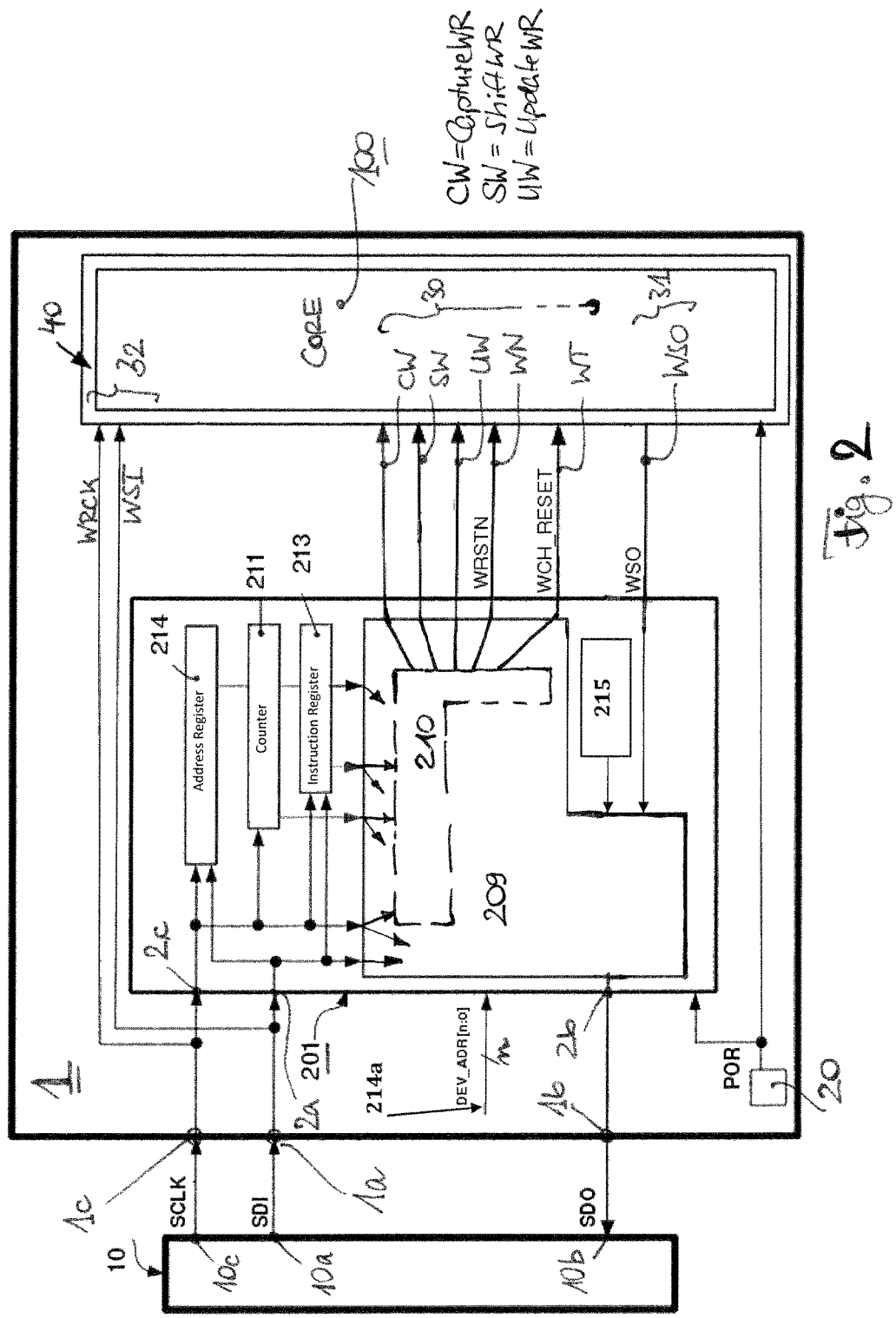

FIG. 2 more detailed illustrates the registers and the structural connections of the serial test interface 201.

The core 100 is equipped with one or multiple wrapper chains across all IOs to achieve full testability. The Wrapper Boundary Register (WBR) 40 is the register through which test data stimuli are applied via SDI as WSI.

Address Register 214 is loaded with an address and Instruction Register 213 is loaded with a wrapper instruction, via the SDI terminal 1a and 2a (the terminal of the SDI signal). An ID-Code 215a can be shifted out through SDO, wherefore a Control Logic 209 is provided that enables either the output WSO of the Wrapper Boundary Register 40 to the SDO output terminal 1b or the ID-code 215a as read from the register 215 to the SDO output terminal—this upon control of the wrapper instruction driven state machine 210.

The slave 201 (with the core 100) may have an m-bit, e.g. 16 bit chip ID (ID-Code 215a) that may contain information of the type and structure of the core 100. The length of this identification is longer than each of the following register lengths of counter 211, address register 214 and Instruction Register 213.

The bit transfer is not limited to 8 bit words. All samples are illustrative only. Other lengths of bits of registers and words may apply.

Figure 13:
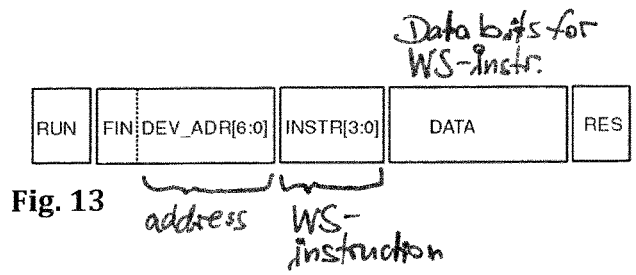
FIG. 13 illustrates a common transaction with sending data according the WS-Instruction.
Figure 14:
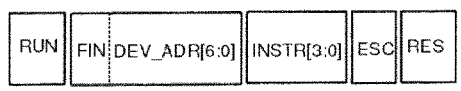
FIG. 14 illustrates a special transaction for a non-data-transfer function.

The device-address 214a may be n-bit long, e.g. 4 bit to 7 bit long and is sent after the 1 bit FIN (Following Instruction), see FIGS. 13 and 14.

The Slave 201 has a 4 bit Instruction Register 213 used to load and store wrapper instructions, e.g. IEEE 1500 Standard instructions, communicated through terminal 1a.

The Serial Test Interface 201 and its terminals 1a, 1b, 1c of the IC is to access to one or multiple IEEE 1500 wrapper cell chains surrounding a core 100 within an SoC 1.

The Serial Test Interface 201 reduces the pin count while retaining a high clock frequency. Each core 100 is equipped with an own slave according to FIG. 4.

The sleek serial interface SSI has only three logic signals:
SCLK serial clock
SDI serial data in
SDO serial data out.

The associated terminals operate with a single master 10 outside the chip 1 and with one or more slave devices 201a, 201b, 201c on the chip. The master 10 selects the desired slave by sending a device-address that corresponds to the e.g. hard-coded STI device address 214a.

The slave(s) 201 have no external reset signal. Therefore, a power on reset 20 (POR) is provided to allow an initialization of the slave(s) and to avoid damage to core 100 (or to COREs 100a, 100b and 100c).

The SSI protocol used is as follows, cf. FIG. 3.

The master 10 (outside the Layout or chip) issues a RESET/RUN sequence.

The master sends 8 bit FIN and the 7 bit slave address, see FIG. 13, through SDI terminal into Address Register 214.

All slaves 201a, 201b, . . . receive and compare the sent address as held by the Address Register 214 with their own device address 214a (supplied to the serial test interface 201 from a source, such as a register or hard coded in a layout).

This slave 201a is selected if the sent address matches his device-address 201a in step 510. For example the device 201a (having state machine 210a) has device address 214a. When the address supplied through the SDI input terminal 1a to the Address Register 214 matches the address 214a, this serial test interface 201a is selected and receives the wrapper commands into its Instruction Register 213 and connects output test signals from the attributed core 100a and its Wrapper Boundary Register 40a (40 as named for core 100a with serial test interface 201a). The other serial test interface 201*b* would have 214*b* as device-address and attributed core 100*b* having a wrapper chain 40*b*. Same for serial test interface 201*c*.

The leading FIN bit determines whether multiple transactions are implemented for the selected slave. If e.g. FIN=1, further instructions follow for the selected slave, see FIGS. 16, 17.

If the address doesn't match in step 510 and FIN=0, each non-selected slave waits for the Reset/Run-sequence and after that for a new slave address in step 510 (RUN=1, FIN=0).

If the address doesn't match and FIN=1, each non-selected slave waits until the master 10 sends the WS_RESET instruction (WRSTN) through SDI input terminal 1*a* from master output terminal 10*a*.

The selected slave proceeds to READ 520, upon RUN=1, FIN=1.

WS Instruction (e.g. 4 bit) follows e.g. a standard instruction as WS_EXTEST, WS_ID or WS_PRELOAD.

Data bits DATA for the instruction INSTR [3:0] follow, e.g. shifting data of Wrapper 10 (length IO) and shift-stop sequence, if necessary for an instruction, see FIG. 13.

To terminate the transaction the master 10 sends the RESET sequence. After the RESET/RUN sequence a new transaction begins with if FIN=0 . . . a new slave address
If FIN=1 . . . the 4-bit instruction To terminate a transaction with FIN=1 and to deselect the slave, the master sends the WS_RESET instruction to generate WRSTN (see FIG. 14) and after that the RESET sequence. After WS_RESET and the RESET/RUN condition the master eTM sends a new address to select another slave.

Figure 4:
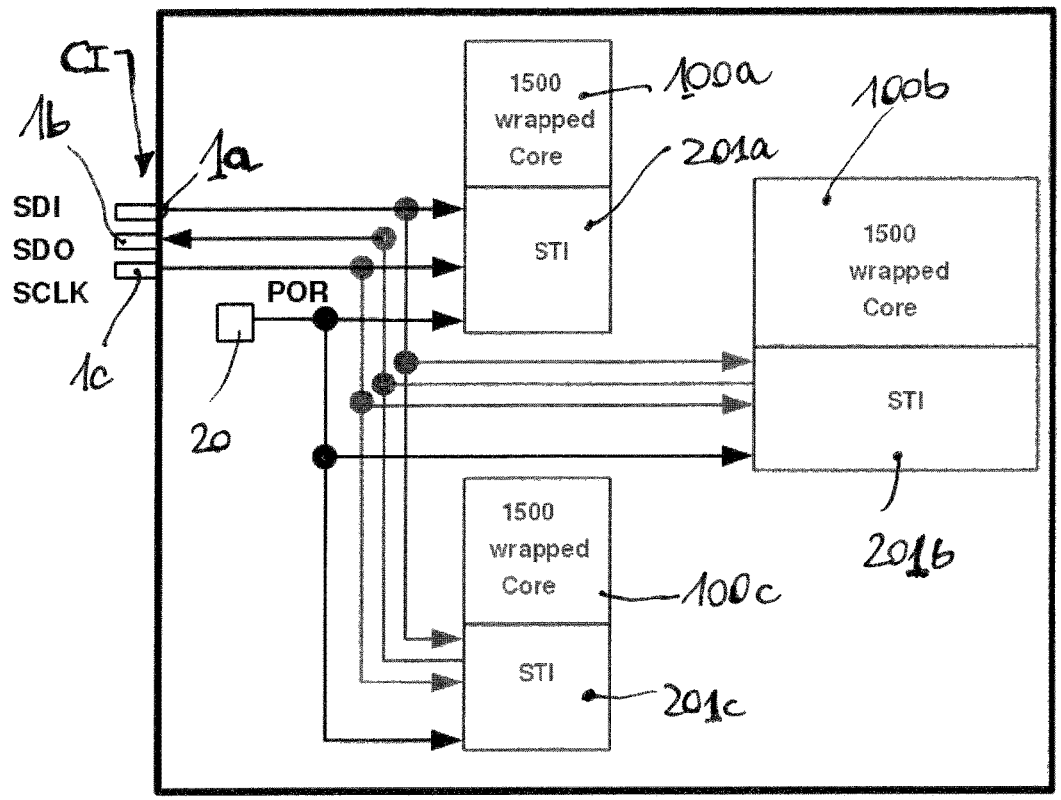
FIG. 4 illustrates the connection of several serial test interfaces 201a, 201b, 201c at IC-level, each one attributed to one core 100a, 100b, 100c.
Figure 5A:
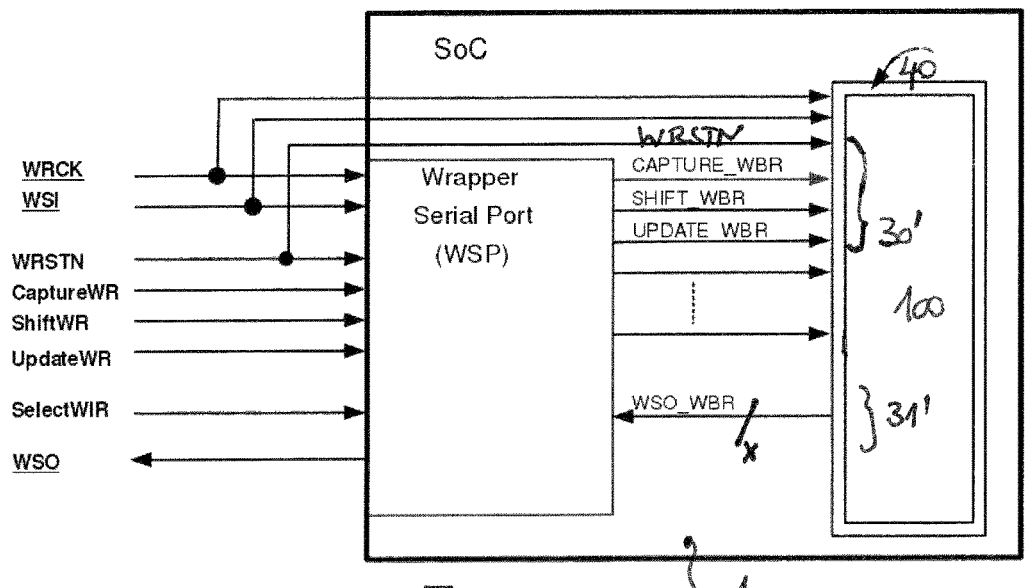
FIG. 5a is prior art and illustrates the architecture with an IEEE 1500 wrapped CORE and WSP and WSC signals.
Figure 5B:
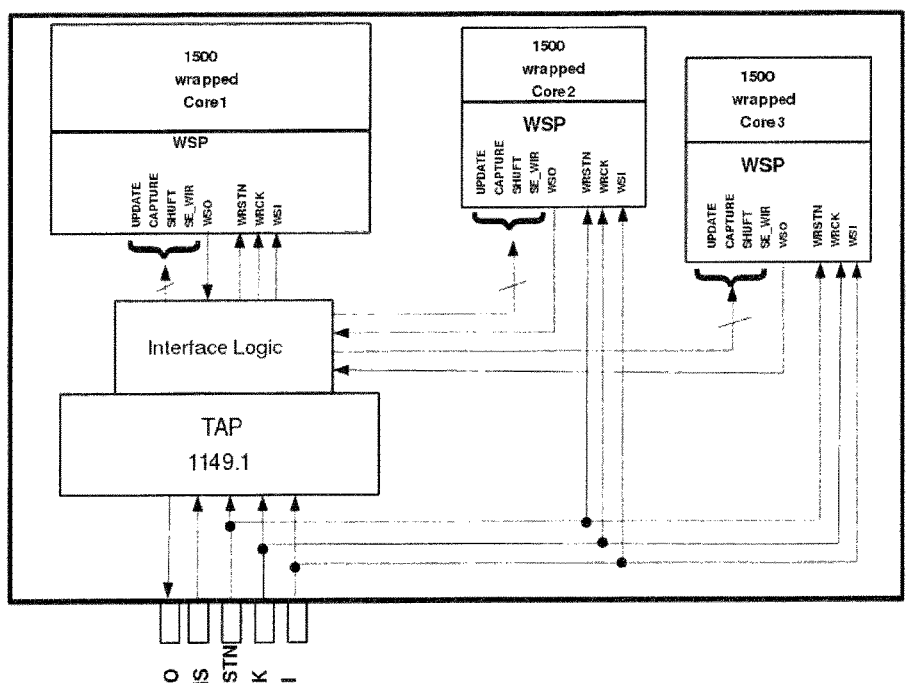
FIG. 5b is prior art and illustrates the IEEE 1149.1 finite state machine (TAP Controller) operating multiple IEEE 1500 wrapped COREs with an on chip additional logic.

The connection of the multiple serial test interfaces (STI) at IC-level of this IC 1\* as Illustrated in FIG. 4.

Each core 100*a*, 100*b* and 100*c* has its own STI 201*a*, 201*b* and 201*c*. Each STI (serial test interface) is directly controlled by the master 10. The master is located outside the chip or layout, e.g. as testing intelligence eTM.

The SDO data lines are tied together and fed back to the master 10. The SDO outputs 2*b* of the unselected slaves on the chip of FIG. 4 are hi-Z and therefore inactive (tri-state output).

FIGS. 1 and 2 show the serial test interface (STI) with those three logic signals and with a power on reset 20 on chip 1. POR 20 is delivered to the serial test interface 201 and the WBR 40.

If multiple Wrapper Boundary Register chains for the core are implemented, the WSO data lines 31 are switched through logic 209 to the output 2*b* and 1*b* carrying the signal SDO.

The output values change on the negative (falling or trailing) edge of SCLK.

The serial interface device 201 has a 4 bit instruction register 213. The following WS-Instructions are used to access the core 100 across the serial test interface STI . . .

| Instruction Name | Explanation |
|---|---|
| WS_EXTEST | used to apply data to all IP pins |
| WS_ID | used to scan out the ID code |
| WS_PRELOAD | used to preload the chain |
| WS_SHIFTUPDATE | only SHIFT and Update |
| WS_RESET | used to generate WRSTN (as internal signal) |
| WS_BYPASS | put the wrapper into a bypass configuration |

Some further instructions are explained in the following table.

| Instruction Name | Explanation |
|---|---|
| WS_CAPTURE | only Capture |
| WS_WCHRESET | only wrapper chain reset for selected wrapper cells, used to generate WCH_RESET (as internal signal) |
| WS_TACC | use to measure access time (delay time testing) |

Figure 3:
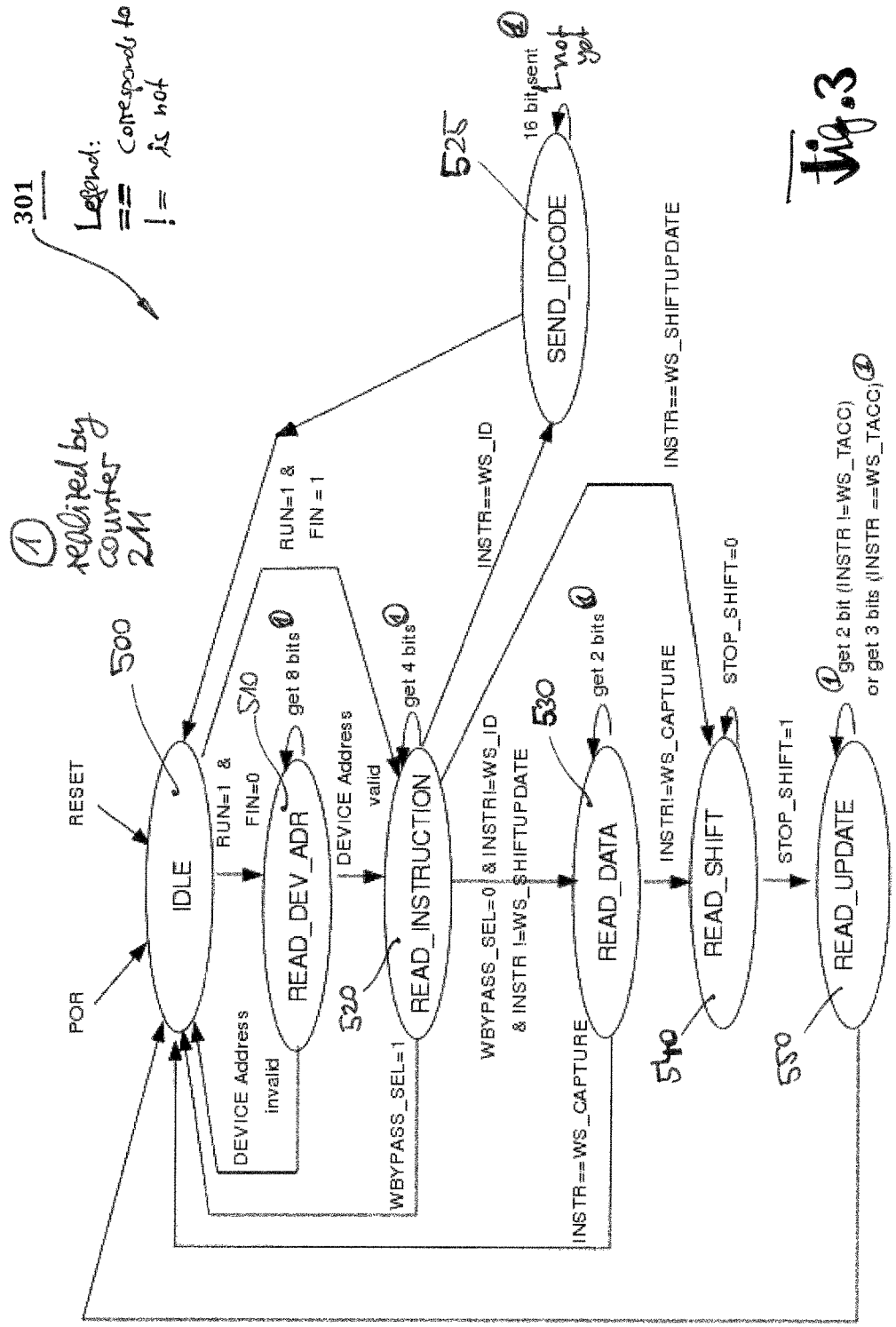

FIG. 3 illustrates the example states of the state machine 210. The slave 201*a* has this state machine 210*a* . . .

to handle the various transactions between the external master 10 and the slave 201 from the slave side:
read the address with the 1 bit FIN (e.g. 8 bit) to select a slave,
read the wrapper-instruction (e.g. 4 bit),
enable the ID code sending in the state Send_IDCode
to enter or skip the states READ-DATA, READ-SHIFT and READ-UPDATE, necessary for the generation of the WBR control signals.
to generate the WBR control signals 30 as CaptureWR, ShiftWR, UpdateWR and WRSTN;
to generate additional WBR control signals 30, e.g. WCH_RESET.

The state machine 210 contains seven states. State transitions are controlled by a clock edge of clock SCLK (e.g. by the negative edge of the clock). The power-on reset POR and the internal RESET signal return the state machine 210 to state IDLE. All transactions start with the RUN condition. The power-on reset POR resets all Flip-Flops (not shown).

The state changes (or changes of states) are based on . . .

a counter value
the currently active wrapper instruction ("INSTR==") "INSTR!=")
FIN=1 following instructions for the selected device (state: IDLE)
device-address=valid (or invalid)
In state 510: READ_DEV_ADR
WBYPASS_SEL=1 bypass path between SDI and SDO (state 520:
READ_INSTRUCTION), e.g. for wrapper instruction (=WI)
WS_RESET or WS_WCHRESET
STOP_SHIFT=1 shift operation was completed (state 540: READ_SHIFT)

Figure 8:
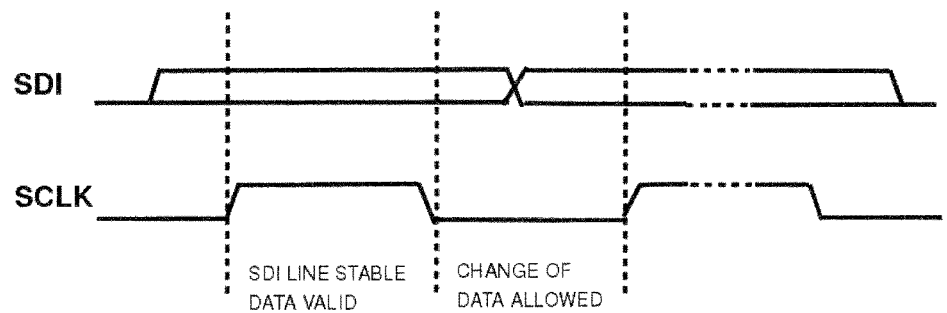
FIG. 8 illustrates timing diagram for bit transfer.

FIG. 8 illustrates a timing diagram for a bit transfer.

The data on the SDI terminal must be stable during the HIGH period of the clock SCLK. The LOW or HIGH state of the data signal can only change when the clock signal is low. The bits are placed on the SDI terminal 2*a* starting with the MSB (Most Significant Bit). According to FIGS. 13 to 15 serial data SDI is transferred in sequences of 8 bit (slave or device-address including FIN), 4 bit (WS-Instruction) and with a variable word size (according to wrapper Instruction). The counter 211 counts each bit of the SDI input and decreases or increases his counter value. The state machine 210 reads the counter value and changes the states as shown in FIG. 3, after all bits have been received, such as 8 bit, 4 bit or 2 bit according to FIG. 3. The corresponding state changes are shown there, such as a change from state 510 to state 520 upon the 8 bit were received, according to 8 bits (of the SDI signal). This may be enabled by using the counter to determine when the required bits have passed the SDI port for bit transfer. Either the counter has increased its count by e.g. 8 or decreased by e.g. 8, both facts indicating that 8 bits are present ("get 8 bit").

Figure 9:
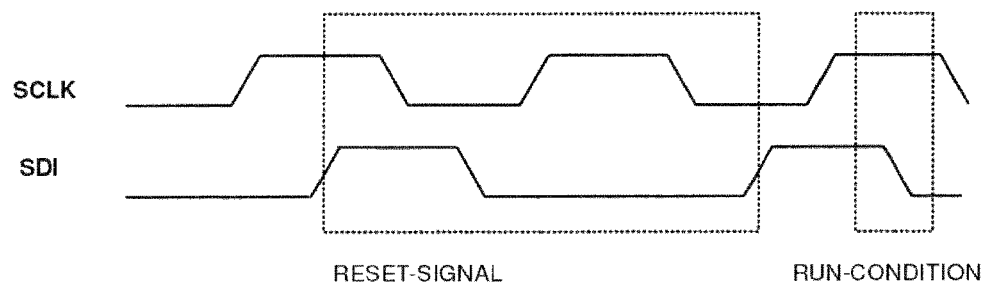
FIG. 9 illustrates the RESET/RUN (R/R) condition for the Slave 201.

FIG. 9 illustrates the RESET/RUN condition for the slave. Clock idle state is low. The RESET/RUN sequence and the STOP_SHIFT sequence are the only places where SDI is allowed to change while SCLK is high. With the LOW to HIGH transition on the SDI signal while SCLK is HIGH the RESET-Signal is generated for the slave. With the internal RESET signal initialization of a part of the slave takes place.

The internal RESET-Signal terminates the actual transaction. The first HIGH to LOW transition on the SDI signal while SCLK is high after RESET starts a new data transfer. The beginning of a new data transfer Is only possible after the RESET/RUN sequence. The RESET/RUN sequence has no influence to the wrapper chains. After the RESET/RUN sequence the master 10 sends a new address for another serial test interface (slave) or a new wrapper-instruction for the Instruction Register 213.

Figure 10:
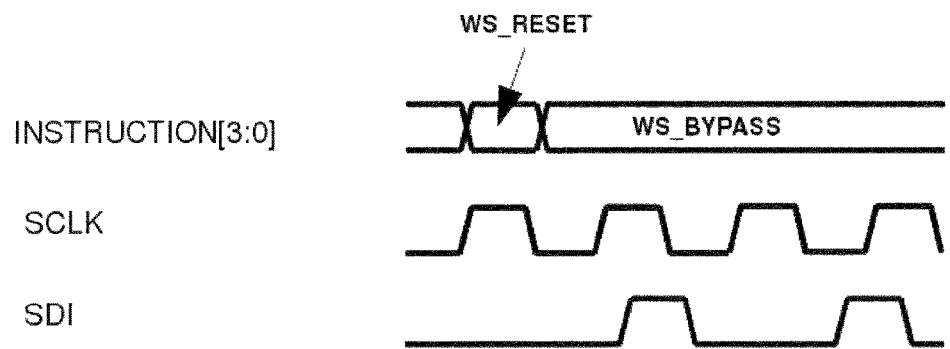
FIG. 10 illustrates the generation of the internal WRSTN-signal.

FIG. 10 illustrates the generation of the internal WRSTN-signal. The instruction that is shown there is the WS_RESET contained in the instruction register 213 and upon reading by the state machine 210 it will provide the WRSTN signal. Further clock and data input are shown in FIG. 10.

All slaves 201 of FIG. 2 (a single slave 201 on the chip) or several slaves 201a, 201b and 201c of FIG. 4 have no external RESET-Signals, only a common power on reset 20 on chip. Therefore, an internal WRSTN signal is generated by the WS_RESET instruction which instruction is supplied through SDI pin 1a. This is actually one of the control signals of the IEEE 1500 standard. WRSTN is the active-low wrapper reset signal. It will only belong to its associated wrapper chain and will not leave the corresponding serial test interface that controls the control signals 30 of this wrapper chain.

WRSTN active low forces its corresponding slave into a disabled state. If FIN=1, only the WRSTN signal can terminate transactions for its selected slave. After WRSTN is active low and following the RESET/RUN-sequence the data transfer is started with a new device-address.

WRSTN resets the Instruction Register 213 and puts the WBR 40 into its normal system mode (reset the wrapper-chain cells). If FIN=1 the instruction WS_RESET will be evaluated by all slaves that are on the chip, thus for example slaves 201a, 201b und 201c of FIG. 4. This results in an evaluation of the instruction WS_RESET by all selected and unselected slaves on the chip 1*. Selected is a slave, when its device address matches the value of the address register 214. The other slaves on the chip are not selected (unselected).

A problem of shift operations is that the length of the wrapper chains is not fixed. The slave needs information to terminate the shift operation of the Wrapper chain cells. The amelioration is a stop-shift.

The master 10 sends a stop-shift sequence to the Slave to finish the shifting of data. A disadvantage might be that stop-shift is dependent from the value of the last SDI bit.

Figure 11:
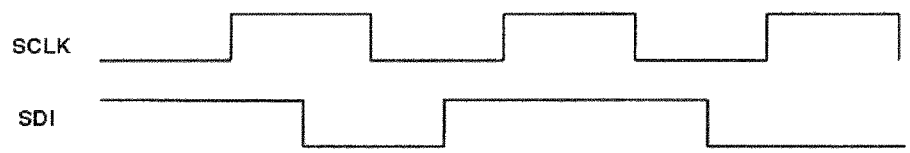
FIG. 11 illustrates the STOP_SHIFT sequence, if the last shift bit (SDI) is 'HIGH'.

FIG. 11 illustrates the STOP_SHIFT sequence, if the last shift bit (SDI) is 'HIGH'.

Figure 12:
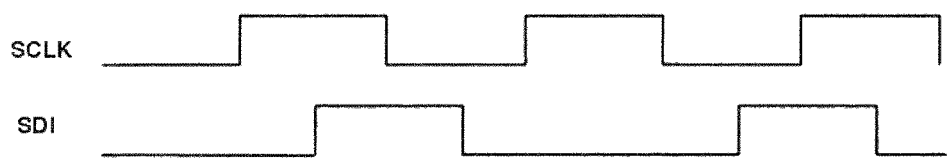
FIG. 12 illustrates the STOP_SHIFT sequence, if the last shift bit (SDI) is 'LOW'.

FIG. 12 illustrates the STOP_SHIFT sequence, if the last shift bit (SDI) is 'LOW'.

FIG. 13 illustrates a common transaction that is with sending data according the WS-Instruction (INSTR).

A transaction begins with the RUN sequence. After the 1 bit FIN and 7 bit device-address follows the 4 bit WS-Instruction. DATA are sent according the WS-Instruction e.g. DATA for CaptureWR, ShiftWR and UpdateWR and DATA for a special operation, e.g. DATA for reading or writing an NVM (non-volatile memory) as core 100.

The size of the data to be transferred is not fixed. A transaction ends with a Reset (RES) condition.

FIG. 14 illustrates a special transaction for a non-data-transfer function. Special transactions are non-data-transfer functions. After the 4 bit INSTR is only 1 bit to enter the Wrapper Serial Control necessary. The Reset Sequence follows after the 1 bit ESC.

Figure 15:
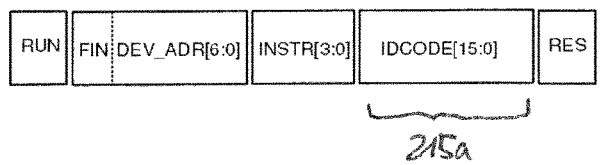
FIG. 15 illustrates a send ID-Code 215a transaction.

Only two special transactions are currently defined . . .
The first one is used to generate WRSTN
The second one is used to generate WCH_RESET FIG. 15 illustrates a send ID-Code transaction. The transaction begins with the RUN sequence. After the 1 bit FIN and 7 bit device-address the 4 bit WS-instruction follows. The 4 bit WS_INSTRUCTION is set to WS_ID.

The slave sends the 16 bit ID-Code 215a using the control logic 209 and gates the ID-code to SDO terminal 1b (through terminal 2b of the slave 201). The terminal 1b for the SDO output changes state at the falling edge of SCLK. The transaction ends with a reset condition (RES). The state 525 changes to IDLE state 500 after 16 bits were sent, see FIG. 3 at Send_IDCode. As long as the send process has not ended, state 525 pertains. The counter 211 is used to count the amount of serially sent bits, e.g. 16 bit as identified.

Figure 16:
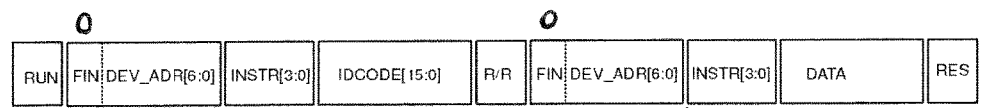
FIG. 16 illustrates an example with two subsequent transactions and FIN=0.

FIG. 16 illustrates an example with two transactions and FIN=0. In the example FIN is set to zero. That is "no following instructions" for the selected slave. A device address is sent after the end of the first transaction.

Figure 17:
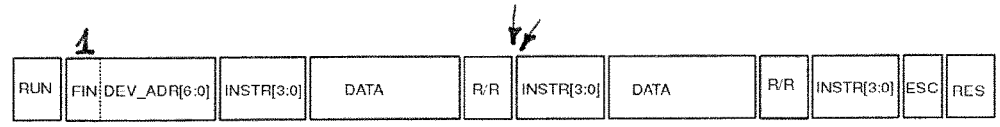
FIG. 17 illustrates an example with multiple subsequent transactions and FIN=1.

FIG. 17 illustrates an example with multiple transactions and FIN=1. In the example FIN is set to one. Thus further instructions follow for the selected slave. To deselect the Slave there has to be sent the instruction WS_RESET.

All bit lengths given above are examples only.

The invention claimed is:

1. A serially operable interface device on a chip (1), the interface device (201) for generating control signals for a Wrapper Boundary Register (40, WBR) on chip (1) level, said wrapper control signals (30) complying with a given standard for testing a core device (100), said core device provided on the chip (1) as well and having the Wrapper Boundary Register, the serial interface device (201) comprising:
  one physical Data Input (2a) and one physical Data Output (2b) and no more than the input (SDI) for and the output (SDO) of the serial interface device (201) are coupled to a respective terminal (1a, 1b) on said chip (1) containing the interface device (201) and the core device (100) with the Wrapper Boundary Register;
  a physical Clock Input (2c) that is coupled to a third terminal (1c) on said chip (1) on chip level for supplying a clock signal (SCLK) to the serial interface device (201);
  an Address Register (214) for holding a received address for comparison to a device-address (214a);
  an Instruction Register (213) to receive and hold wrapper-instructions supplied through the terminal (1a) supplying the Data Input (SDI) on said chip (1);
  a control logic (209) including a state machine (210) for handling transactions from an external master (10) that supplies logical data input (SDI) to physical data input terminal (1a) and the serial interface device (201) returns logical data output (SDO) to said physical data output terminal (2b) and for said external master (10) from the Wrapper Boundary Register (40) of the core device (100);

wherein the state machine (210) is configured to generate the wrapper control signals (30) of the given standard for the core device (100) having the Wrapper Boundary Register; and read an address held by the Address Register (214) and compare it to the device-address (214a);

read a currently active wrapper-instruction, held by the Instruction Register (213); and send the logic output test (SDO), as taken from the Wrapper Boundary Register.

2. The device of claim 1, further having a counter (211) to control a data transmission size in certain states of the state machine (210), the counter receiving the clock signal (SCLK) supplied to the serial interface device.

3. The device of claim 1, the state machine (210) handling transactions between the external master (10) and itself, wherein the state machine (210) is capable to generate an additional Wrapper Boundary Register control signal (WT), e.g. WCH_RESET, to and for the Wrapper Boundary register of the core device (100).

4. The device of claim 1, wherein the State Machine (210) is configured and capable to generate all Wrapper Boundary Register control signals (30; CW, SW, UW, WN) of the given standard, and the SelectWIR signal of the IEEE 1500 standard not being a Wrapper Boundary Register control signal.

5. The device of claim 1, wherein the state machine (210) generates at least some Wrapper Boundary Register control signals (30) comprising one or more of the control signals for the IEEE 1500 Wrapper Boundary Register.

6. The device of claim 1, wherein an output signal (WSO) of the Wrapper Boundary Register is supplied to the serial interface device (201) or directly to the terminal (2b) of the physical Data Output (SDO).

7. The device of claim 1, wherein the logical data input signal (SDI) at physical Data Input Terminal (1a) is supplied to the WBR (40) as Input Signal (WSI).

8. The device of claim 1, wherein the clock signal (SCLK) from the third terminal (1c) is also supplied to the Wrapper Boundary Register as clock signal (WRCK).

9. The device of claim 1, wherein the clock signal (SCLK) from the third terminal (1c) is supplied to the serial interface device (201).

10. The device of claim 1, wherein the logical data input signal (SDI) at physical Data Input Terminal (1a) is supplied to the Address Register (214), the Instruction Register (213) and to the control logic (209) containing the state machine (210), but not to the state machine (210).

11. The device of claim 1, wherein the coupling is an electrical conductive connection.

12. The device of claim 1, further having an Identification Register (215) containing an identification-code (215a) of the core device (100).

13. The device of claim 1, the serial interface device (201) further having an additional device-address source, supplying a device-address (214a) of a corresponding core device (100a) associated with the interface device, when multiple w cores (100a, 100b) are on the chip (1) and each core has an own dedicated serial interface device (201a, 201b).

14. The device of claim 1, further having a counter (211), supplied with the clock signal (SCLK) through the third terminal (1c) to control the changes of states (510, 520, 525, 530, 550) of the state machine (210).

15. A serially operable interface device on a chip, the interface device (201) for generating control signals for a Wrapper Boundary Register on chip, said wrapper control signals (30) complying with a given standard for testing a core device (100), said core device provided on the chip (1) as well and having the Wrapper Boundary Register, the chip comprising:

one physical Data Input (1a) for test purposes and one physical Data Output (1b) for test purposes and no more than an input and an output terminal of the serial interface device (201) are coupled to the terminals (1a, 1b) on said chip containing the interface device (201) and the core device (100) with the Wrapper Boundary Register, and a physical Clock Input (1c) for test purposes that is coupled to a third terminal (1c) on said chip on chip level for supplying a clock signal (SCLK) to the serial interface device (201);

the serial interface device (201) on chip further comprising an Instruction Register (213) to receive and hold wrapper-instructions supplied through the physical data input terminal (1a);

wherein the state machine is configured to:

read a currently active wrapper-instruction, as held by the Instruction Register (213);

generate and provide on-chip wrapper control signals (30) of the given standard for the core device (100) having the Wrapper Boundary Register according to the wrapper-instruction read from the Instruction Register.

16. The device of claim 15, the serial interface device (201) further having an Address Register (214) to receive and hold an address supplied through the physical data input terminal (1a) for comparison with an individual device-address (214a) of this serial interface device (201a) and a corresponding core (100a), when multiple serial interface devices (201a, 201b, 201c) each attributed to a corresponding core (100a, 100b, 100c) are present on the chip (1*).

17. The device of claim 15, wherein the control logic (209) has access to an Address Register (214), being configured for holding a received address, the control w logic (209) being configured for reading the address as held by the Address Register (214).

18. The device of claim 15, further having a counter (211), supplied with the clock signal (SCLK) through the third terminal (1c) to control at least some changes of states (510, 520, 525, 530, 550) of the state machine (210).

19. The device of claim 15, wherein at least some changes of states of the state machine (210) depend at least from a counter value of the counter (211) and a wrapper-instruction as read from the Instruction Register (213), the Instruction Register (213) having received the wrapper-instruction through the physical data input terminal (1a).

20. The device of claim 15, further having an Identification Register (215) for holding an ID-Code (215a) identifying the core device (100).

21. The device of claim 20, the ID-Code of the Identification Register (215) identifying the core device (100) is sent by control of the state machine (210) and a control logic (209) in the serial test interface (201) to the single output terminal (1b) to the external master (10), upon an corresponding wrapper-instruction as read from the 3D Instruction Register (213).

22. The device of claim 21, the control logic (209) in the serial test interface (201) acts as gateway to the single output terminal (1b) for supplying either—but not both a the same time—the ID-Code (215a) of the Identification Register (215) or the logical output test signal (WSO) returning from the Wrapper Boundary Register of the core device (100) to the external master (10) by control of the control logic (209) upon an corresponding wrapper-instruction as read from the Instruction Register (213).

23. The device of claim 15, further having a power-on detector (20) for supplying a power on reset signal to the serial test interface (201) and the Wrapper Boundary Register of the core (100) for common initialization.

24. The device of claim 15, the clock signal (SCLK) supplied through the third terminal (1c) is supplied to the Wrapper Boundary Register and the serial test interface (201).

25. A method of testing wrapped cores within a System-on-Chip, comprising:
   each wrapped core of the wrapped cores having an associated serial interface device;
   each interface device having a unique device address, not being the same, although a structure of all serial interface devices is the same;
   each serial interface device further having an Address Register, receiving and holding an address supplied through a test input terminal; and
   each serial interface device comparing the supplied address with an individual interface device-address as the unique device address of each serial interface device for the associated wrapped core on the System-on-Chip;
   whereby electing a serial interface device having a device address that matches the supplied address held by the Address Register.

26. The method of claim 25, wherein each serial interface device (201a, 201b, 201c) having a structure comprising:
   one physical Data Input (2a) and one physical Data Output (2b) and no more than the input (SDI) for and the output (SDO) of the serial interface device (201) are coupled to a respective terminal (1a, 1b) on said chip (1) containing the interface device (201) and the core device (100) with the Wrapper Boundary Register (40); and a physical Clock Input (2c) that is coupled to a third terminal (1c) on said chip (1) on chip level for supplying a clock signal (SCLK) to the serial interface device (201);
   an Address Register (214) for holding a received address for comparison to a device-address (214a);
   an Instruction Register (213) to receive and hold wrapper-instructions supplied through the terminal (1a) supplying the Data Input (SDI) on said chip (1); and
   a control logic (209) including a state machine (210) for handling transactions from an external master (10) that supplies logical data input (SDI) to physical data input terminal (1a) and the serial interface device (201) returns logical data output (SDO) to said physical data output terminal (2b) and for said external master (10) from the WBR (40) of the core device (100).

27. The device of claim 2, wherein the certain states are READ_DEV_ADR, READ_INSTRUCTION, SEND_ID-CODE, READ_DATA and READ_UPDATE.

28. The device of claim 7, wherein the logical data input signal (SDI) at physical Data Input Terminal is directly supplied to the WBR as Input Signal (WSI).

29. The device of claim 8, wherein the clock signal (SCLK) from the third terminal is directly supplied to the Wrapper Boundary Register as clock signal (WRCK).

30. The device of claim 9, wherein the clock signal (SCLK) from the third terminal is supplied to the serial interface device, therewith to the control logic containing the state machine, the Address Register and the Instruction Register.

31. The device of claim 4, wherein the given standard is CaptureWR, ShiftWR, UpdateWR and WRSTN of the IEEE 1500 standard, the SelectWIR signal of the IEEE 1500 standard not being a WBR control signal.

* * * * *